US009240307B2

(12) United States Patent
Amikura et al.

(10) Patent No.: US 9,240,307 B2
(45) Date of Patent: Jan. 19, 2016

(54) PLASMA PROCESSING APPARATUS

(71) Applicant: TOKYO ELECTRON LIMITED, Tokyo (JP)

(72) Inventors: Norihiko Amikura, Miyagi (JP); Risako Miyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 184 days.

(21) Appl. No.: 14/161,893

(22) Filed: Jan. 23, 2014

(65) Prior Publication Data

US 2014/0203702 A1 Jul. 24, 2014

Related U.S. Application Data

(60) Provisional application No. 61/759,499, filed on Feb. 1, 2013.

(30) Foreign Application Priority Data

Jan. 24, 2013 (JP) ................................. 2013-011278

(51) Int. Cl.
H01J 37/32 (2006.01)
(52) U.S. Cl.
CPC ....... *H01J 37/3244* (2013.01); *H01J 37/32091* (2013.01)
(58) Field of Classification Search
CPC combination set(s) only.
See application file for complete search history.

(56) References Cited

U.S. PATENT DOCUMENTS

| 2007/0158026 | A1* | 7/2007 | Amikura | C23C 16/455 |
| | | | | 156/345.34 |
| 2010/0252197 | A1* | 10/2010 | Kadkhodayan | H01J 37/3255 |
| | | | | 156/345.34 |
| 2011/0226181 | A1* | 9/2011 | Yamamoto | C23C 16/16 |
| | | | | 118/724 |
| 2013/0134138 | A1* | 5/2013 | de la Llera | H01J 37/3244 |
| | | | | 219/121.52 |

FOREIGN PATENT DOCUMENTS

JP 2009-117477 A 5/2009

* cited by examiner

*Primary Examiner* — Nimeshkumar Patel
*Assistant Examiner* — Brenitra M Lee
(74) *Attorney, Agent, or Firm* — Rothwell, Figg, Ernst & Manbeck, P.C.

(57) ABSTRACT

Disclosed is a plasma processing apparatus including a mounting table within a processing container. The mounting table includes a lower electrode. A shower head constituting an upper electrode is provided above the mounting table. A gas inlet tube is provided above the shower head. The shower head includes a plurality of downwardly opened gas ejection holes, and first and second separate gas diffusion chambers on the gas ejection holes. The first gas diffusion chamber extends along a central axis that passes through a center of the mounting table. The second gas diffusion chamber extends circumferentially around the first gas diffusion chamber. The gas inlet tube includes a cylindrical first tube wall and a cylindrical second tube wall provided outside the first tube wall, and defines a first gas inlet path inside the first tube wall, and a second gas inlet path between the first and second tube walls.

6 Claims, 12 Drawing Sheets

PLASMA PROCESSING APPARATUS

CROSS-REFERENCE TO RELATED APPLICATIONS

This application is based on and claims priority from Japanese Patent Application No. 2013-011278 filed on Jan. 24, 2013 with the Japan Patent Office, and U.S. Provisional Patent Application No. 61/759,499 filed on Feb. 1, 2013 with the USPTO, and the disclosures of which are incorporated herein in their entireties by reference.

TECHNICAL FIELD

The present disclosure relates to a plasma processing apparatus.

BACKGROUND

In manufacturing electronic devices such as semiconductor devices or liquid crystal display device, a processing such as, for example, film forming or etching is performed on a workpiece to be processed ("workpiece"). In the processing of such a workpiece, a plasma processing apparatus is widely used. As a kind of such a plasma processing apparatus, a parallel plate type plasma processing apparatus is used.

The parallel plate type plasma processing apparatus is provided with a processing container, a mounting table, and a shower head. The mounting table includes a lower electrode and is provided in the processing container. The shower head is provided above the mounting table so as to supply a processing gas to the inside of the processing container toward a workpiece mounted on the mounting table. In addition, the shower head constitutes an upper electrode. In such a parallel plate type plasma processing apparatus, the processing gas is supplied from the shower head to the inside of the processing container, and a high frequency electric field is generated between the upper electrode and the lower electrode. As a result, plasma of the processing gas is generated and the workpiece is processed by the molecules in the processing gas and/or active species of the molecules.

In the plasma processing apparatus, it is required to reduce variation of processing over the entire in-plane region of the workpiece. Japanese Patent Laid-Open Publication No. 2009-117477 discloses a plasma processing apparatus which allows a flow rate of a processing gas supplied to a plurality of in-plane regions of the workpiece and/or gas species to be adjusted in order to reduce the variation of processing.

Specifically, the plasma processing apparatus of Japanese Patent Laid-Open Publication No. 2009-117477 includes a plurality of gas diffusion chambers which are provided coaxially in the shower head. That is, a first gas diffusion chamber is provided at a central region of the shower head, an annular second gas diffusion chamber is provided outside the first gas diffusion chamber, and an annular third gas diffusion chamber is provided outside the second gas diffusion chamber. In addition, the plasma processing apparatus of the Japanese Patent Laid-Open Publication No. 2009-117477 includes a plurality of gas branch paths and is configured such that processing gases from gas sources are respectively supplied to the plurality of gas diffusion chambers through the gas branch paths at a controlled flow rate.

SUMMARY

A plasma processing apparatus according to an aspect is provided with a processing container, a mounting table, a shower head, and a gas inlet tube. The mounting table is provided within the processing container and includes a lower electrode. The shower head is provided above the mounting table and constitutes an upper electrode. The gas inlet tube is provided above the shower head and connected to the shower head. The shower head is formed with a plurality of gas ejection holes opened downwardly, and a first gas diffusion chamber and a second gas diffusion chamber which are separated from each other are provided on the plurality of gas ejection holes. The first gas diffusion chamber extends along a central axis that passes through the center of the mounting table. The second gas diffusion chamber extends in a circumferential direction in relation to the central axis at least around the first gas diffusion chamber. The gas inlet tube includes a cylindrical first tube wall which is provided along the central axis and a cylindrical second tube wall provided outside the first tube wall. A first gas inlet path configured to introduce a gas into the first gas diffusion chamber is defined inside the first tube wall, and a second gas inlet path configured to introduce the gas into second gas diffusion chamber is defined between the first tube wall and the second tube wall.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Further.

DETAILED DESCRIPTION

Figure 1:
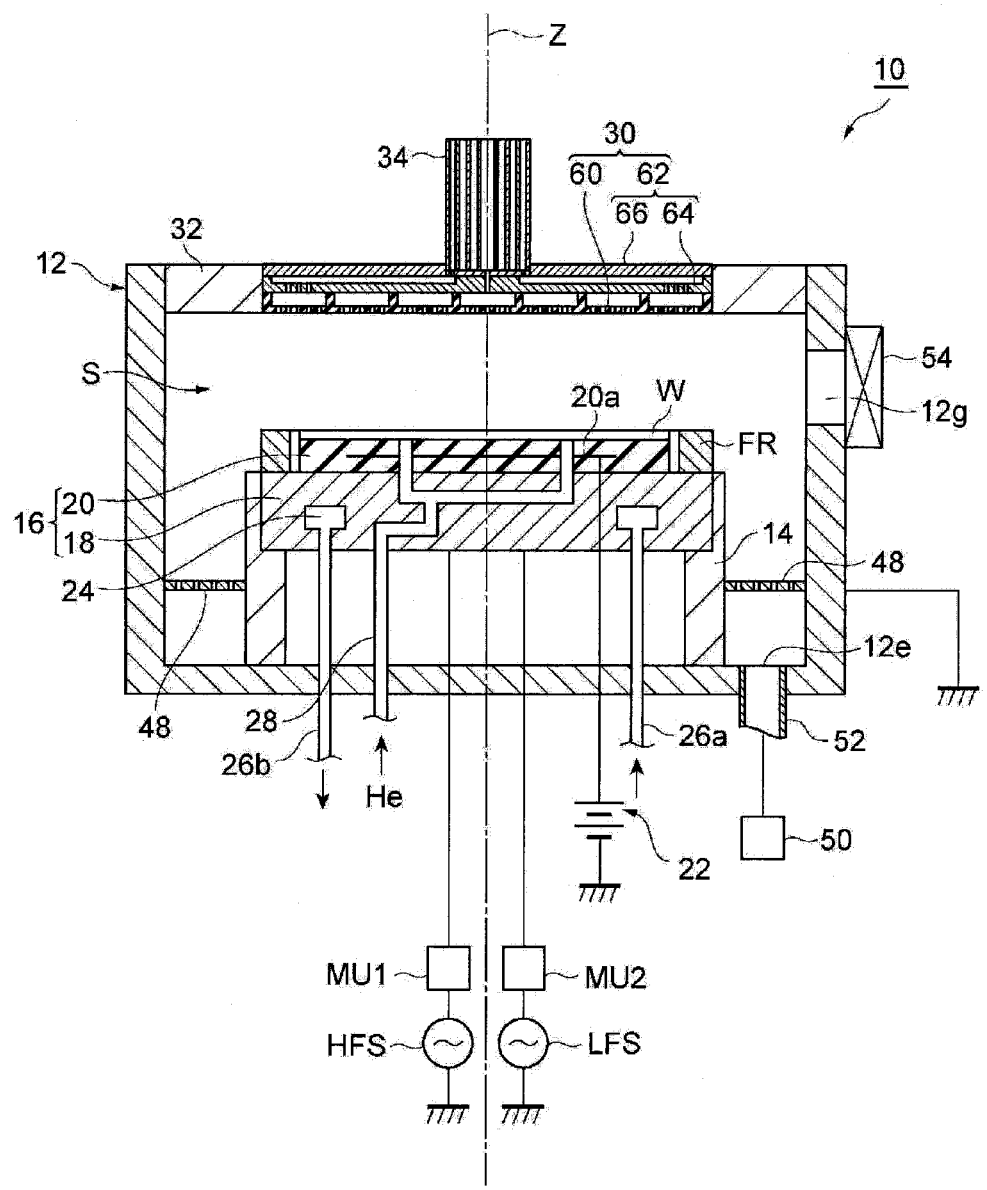
FIG. 1 is a view schematically illustrating a plasma processing apparatus of an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the plasma processing apparatus of Japanese Patent Laid-Open Publication No. 2009-117477, a gas branch path is connected to the first gas diffusion chamber at the center of the first gas diffusion chamber. That is, the gas branch path connected to the first gas diffusion chamber extends along the central axis of the first to third gas diffusion chambers. Meanwhile, the second gas diffusion chamber and the third gas diffusion chamber are respectively connected with corresponding gas branch paths at positions spaced apart from the central axis. Accordingly, it may be required to configure the second gas diffusion chamber and the third gas diffusion chamber to have a relatively large space in order to diffuse a gas with small deviation between a region in the vicinity of a gas branch path connection position and a region spaced apart from the gas branch path connection position. Otherwise, it may be required that a plurality of gas branch paths are provided symmetrically with respect to the central axis and connected to the second gas diffusion chamber and the third gas diffusion chamber.

Under this background, what is requested in the related technical field is a plasma processing apparatus which has a simple configuration capable of reducing deviation in gas diffusion within the inside of each of a plurality of gas diffusion chambers of a shower head.

A plasma processing apparatus according to the present disclosure is provided with a processing container, a mounting table, a shower head, and a gas inlet tube. The mounting table is provided within the processing container and includes a lower electrode. The shower head is provided above the mounting table and constitutes an upper electrode. The gas inlet tube is provided above the shower head and connected to the shower head. The shower head is formed with a plurality of gas ejection holes which are opened downwardly, and provided with a first gas diffusion chamber and a second gas diffusion chamber on the plurality of gas ejection holes. The first gas diffusion chamber and the second gas diffusion chamber are separated from each other. The first gas diffusion chamber extends along a central axis that passes through a center of the mounting table. The second gas diffusion chamber extends in a circumferential direction with respect to the central axis at least around the first gas diffusion chamber. The gas inlet tube includes a cylindrical first tube wall provided along the central axis and a cylindrical second tube wall provided outside the first tube wall. The gas inlet tube defines a first gas inlet path configured to introduce a gas into the first gas diffusion chamber, inside the first tube wall, and a second gas inlet path configured to introduce a gas into the second gas diffusion chamber, between the first tube wall and the second tube wall.

In the plasma processing apparatus described above, the gas inlet tube includes the first tube wall and the second tube wall which are substantially coaxially provided, and defines the first gas inlet path and the second gas inlet path by the tube walls with the central axis substantially as the center thereof. Accordingly, the gas inlet tube may provide the first gas inlet path and the second gas inlet path which extend substantially coaxially with respect to the central axis with a relatively simple structure. In addition, the gas inlet tube provides the first gas inlet path to be substantially coaxial to the first gas diffusion chamber of the shower head which extends along the central axis, and provides the second gas inlet path to be substantially coaxial to the second gas diffusion chamber which extends substantially annularly along the central axis. Accordingly, the distances from the first gas inlet path to the respective regions of the first gas diffusion chamber in the circumferential direction are substantially equal to each other, and the distances from the second gas inlet path to the respective regions of the second gas diffusion chamber in the circumferential direction are substantially equal to each other. As a result, the deviation in gas diffusion in the inside of each of the first gas diffusion chamber and the second gas diffusion chamber may be reduced.

In an aspect, the shower head includes a shower plate formed with the plurality of gas ejection holes, a first wall, a second wall, and a gas distribution unit. The first wall has a cylindrical shape that extends in a direction where the central axis extends. The first wall is provided on the shower plate and defines the first gas diffusion chamber. The second wall has a cylindrical shape that extends in the direction where the central axis extends. The second wall is provided on the shower plate and around the first wall and defines the second gas diffusion chamber together with the first wall. The gas distribution unit is provided on the first wall and the second wall. The gas distribution unit is provided with a plurality of gas flow paths that extend in a radial direction with respect to the central axis from a position below the second gas inlet path to a position above the second gas diffusion chamber. In the plasma processing apparatus of the present aspect, the gas from the second gas inlet path may be guided above the second gas diffusion chamber by the plurality of gas flow paths that extend in the radial direction.

In another aspect, the gas distribution unit includes a first layer and a second layer. The first layer includes a top surface and a bottom surface joined to a top portion of the first wall and a top portion of the second wall, respectively. The second layer is provided on the top surface of the first layer. On the top surface of the first layer, a plurality of grooves that extend in the radial direction with respect to the central axis from a position below the second gas inlet path to a position above the second gas diffusion chamber are formed. The plurality of grooves constitute the plurality of gas flow paths. The first layer is formed with a plurality of through holes that penetrate the first layer above the second gas diffusion chamber to interconnect the plurality of gas flow paths and the second gas diffusion chamber.

In another aspect, wherein the shower head includes: a shower plate formed with the plurality of gas ejection holes, a first wall, a second wall, a first upper wall, and a second upper wall. The first wall has a cylindrical shape that extends in a direction where the central axis extends and is provided on the shower plate. The second wall has a cylindrical shape that extends in the direction where the central axis extends and is provided on the shower plate and around the first wall. The first upper wall is provided on the first wall to face the shower plate. The second upper wall is provided on the second wall to face the shower plate at a position above the first upper wall. In the present aspect, the first gas diffusion chamber is formed inside the first wall and below the first upper wall and the second gas diffusion chamber is formed between the first wall and the second wall and between the first upper wall and the second upper wall. The first tube wall of the gas inlet tube includes a lower end portion that adjoins the first gas diffusion chamber. The lower end portion of the first tube wall is formed with a plurality of first holes that communicate the first gas inlet path and the first gas diffusion chamber with each other. In addition, the second tube wall of the gas inlet tube includes a lower end portion that adjoins the second gas diffusion chamber between the first upper wall and the second upper wall. The lower end portion of the second tube wall is formed with a plurality of second holes that communicate the second gas inlet path and the second gas diffusion chamber with each other. In the present aspect, the second gas diffusion chamber extends in the radial direction from the vicinity of the gas inlet tube. Further, the second gas diffusion chamber extends on the shower plate. Accordingly, the gas from the second gas inlet path may be guided to a region above the shower plate in the second gas diffusion chamber while suppressing the deviation in gas diffusion.

In an aspect, the plurality of first holes and the plurality of second holes extend in the radial direction with respect to the central axis, the plurality of first holes are equally arranged in the circumferential direction with respect to the central axis, and the plurality of second holes are equally arranged in the circumferential direction with respect to the central axis. According to the present disclosure, the gas from the gas inlet tube may be supplied in the radial direction to the inside of each of the gas diffusion chambers and the deviation in gas diffusion in each of the gas diffusion chambers may be further reduced.

Meanwhile, the number of the gas diffusion chambers in the shower head may be three or more. The number of the gas inlet paths of the gas inlet tube may be three or more. For example, the shower head may further include a third gas diffusion chamber provided on the plurality of gas ejection holes that are opened downwardly. The third gas diffusion chamber extends in the circumferential direction with respect to the central axis at least around the second gas diffusion chamber. The gas inlet tube may further include a cylindrical third tube wall provided outside the second tube wall and may define a third gas inlet path configured to introduce a gas into the third gas diffusion chamber, between the second tube wall and the third tube wall.

As described above, according to the present disclosure, there is provided a plasma processing apparatus which has a simple configuration capable of reducing deviation in gas diffusion in the inside of each of a plurality of gas diffusion chambers of a shower head.

Hereinafter, various exemplary embodiments will be described in detail with reference to accompanying drawings. In the respective drawings, similar components will be denoted by like reference numerals and will not be repeatedly described.

FIG. 1 is a view schematically illustrating a plasma processing apparatus according to an exemplary embodiment. In FIG. 1, a cross-sectional configuration of the plasma processing apparatus 10 is schematically illustrated. The plasma processing apparatus 10 is a capacitively coupled parallel plate plasma processing apparatus and is provided with a substantially cylindrical processing container 12. The processing container 12 defines a processing space S therein. The processing container 12 is made of, for example, aluminum. An inner surface of the processing container 12 is subjected to alumite treatment or coated with a coating material such as $Y_2O_3$ in order to secure plasma resistance. In addition, the processing container 12 is frame grounded.

On the bottom of the processing container 12, a cylindrical support unit 14 made of an insulation material is arranged. The support unit 14 supports the mounting table 16. The mounting table 16 includes a lower electrode 18 and an electrostatic chuck 20.

The lower electrode 18 is made of a metal such as, for example, aluminum, and has a substantially disc shape. To the lower electrode 18, a first high frequency power source HFS is connected through a matching unit MU1. The first high frequency power source HFS is a power source configured to generate a high frequency power for generating plasma. The first high frequency power source HFS generates a high frequency power having a frequency in a range 27 MHz to 100 MHz, for example, a 40 MHz. The matching unit MU1 includes a circuit for matching the output impedance of the first high frequency power source HFS and the input impedance of the load side (lower electrode 18 side).

In addition, a second high frequency power source LFS is connected to the lower electrode 18 through a matching unit MU2. The second high frequency power source LFS generates a high frequency bias power for drawing ions to the wafer W and supplies the high frequency bias power to the lower electrode 18. The frequency of the high frequency bias power is in a range of 400 kHz to 13.56 MHz, for example, 3 MHz. The matching unit MU2 includes a circuit for matching the output impedance of the second high frequency power source LFS and the input impedance of the load side (lower electrode 18 side).

On the lower electrode 18, the electrostatic chuck 20 is provided. The electrostatic chuck 20 constitutes a mounting table configured to support a workpiece to be processed W ("wafer W"), together with the lower electrode 18. The electrostatic chuck 20 has a configuration in which an electrode 20a which is a conductive film is interposed between a pair of insulation layers or insulation sheets. A DC power supply 22 is electrically connected to the electrode 20a. The electrostatic chuck 20 may attract and maintain the wafer W by an electrostatic force such as Coulomb force generated by a DC voltage supplied from the DC power supply 22.

A focus ring FR is arranged on the lower electrode 18 and around the electrostatic chuck 20. The focus ring FR is provided in order to improve in-plane uniformity in processing a wafer W. The focus ring FR is made of a material which may be properly selected depending on a material of a workpiece to be processed. For example, the focus ring FR may be made of silicon or quartz.

A coolant chamber 24 is provided within the lower electrode 18. The coolant chamber 24 is circulatingly supplied with a coolant of a predetermined temperature, for example, cooling water, from a chiller unit provided in the outside through pipes 26a, 26b. When the temperature of the coolant circulating in this manner is controlled, the temperature of the wafer W placed on the electrostatic chuck 20 may be controlled. In addition, the plasma processing apparatus 10 is provided with a gas supply line 28. The gas supply line 28 supplies a heat transfer gas, for example, He gas, between the top surface of the electrostatic chuck 20 and the rear surface of the wafer W from a heat transfer gas supply mechanism.

In addition, a shower head 30 is provided above the mounting table 16. The shower head 30 is supported at the upper portion of the processing container 12 through an insulative shielding member 32. A gas inlet tube 34 is connected to the shower head 30. The shower head 30 supplies a gas introduced from the gas inlet tube 34 to the processing space S. In addition, the shower head 30 constitutes an upper electrode. In the plasma processing apparatus 10, a high frequency electric field is generated between the upper electrode and the lower electrode 18 so that a gas within the processing space S is excited to generate plasma. As a result, the wafer W placed on the mounting table 16 is processed by activated species of molecules or atoms that form the gas. Meanwhile, various processings such as etching and film forming may be exemplified as processings performed using the plasma processing apparatus 10.

An exhaust plate 48 is provided on the bottom side of the processing container 12. The exhaust plate 48 extends in an annular form between the support unit 14 and the inner wall of the processing container 12. The exhaust plate 48 may be formed by coating a ceramic such as $Y_2O_3$ on an aluminum material. The exhaust plate 48 is formed with a plurality of through holes so as to communicate spaces above and below the exhaust plate 48 with each other.

An exhaust port 12e is formed in the processing container 12 below the exhaust plate 48. An exhaust apparatus 50 is connected to the exhaust port 12e through an exhaust tube 52. The exhaust apparatus 50 includes a vacuum pump such as a turbo molecular pump and may decompress the inside of the processing container 12 to a desired degree of vacuum. In addition, a carry-in/carry-out port 12g of a wafer W is provided through a side wall of the processing container 12 and the carry-in/carry-out port 12g is configured to be capable of being opened/closed by a gate valve 54.

Figure 2:
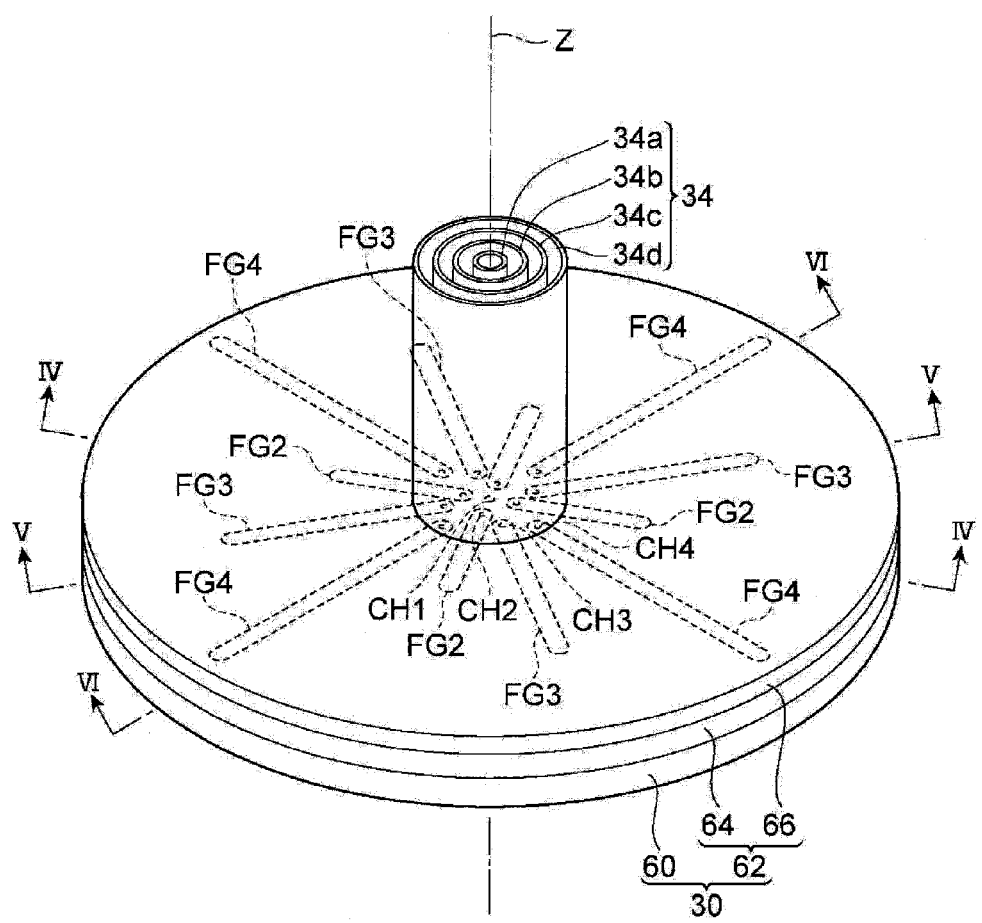
FIG. 2 is a perspective view illustrating a shower head and a gas inlet tube of an exemplary embodiment.
Figure 3:
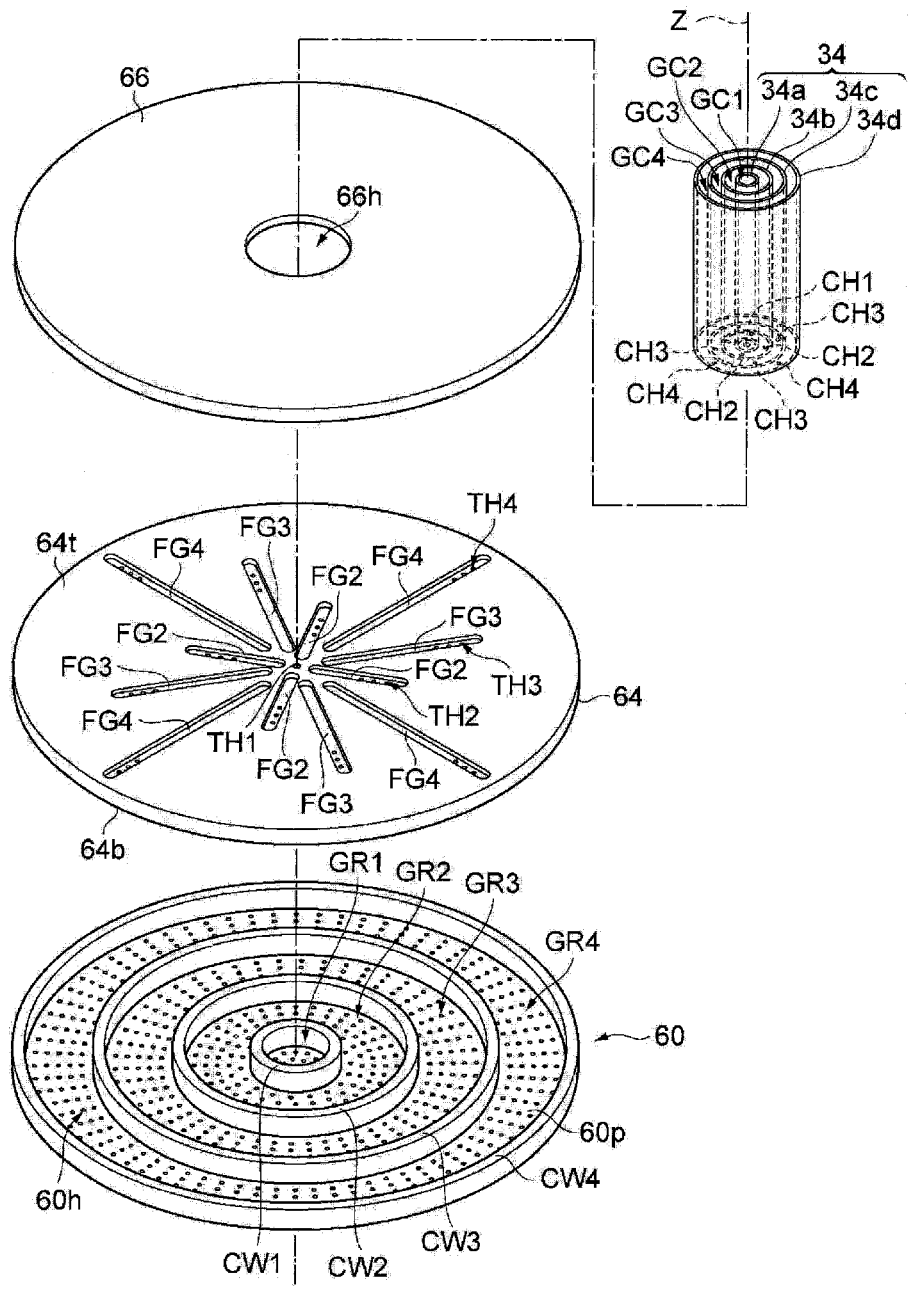
FIG. 3 is an exploded perspective view illustrating the shower head and the gas inlet tube of FIG. 2.
Figure 4:
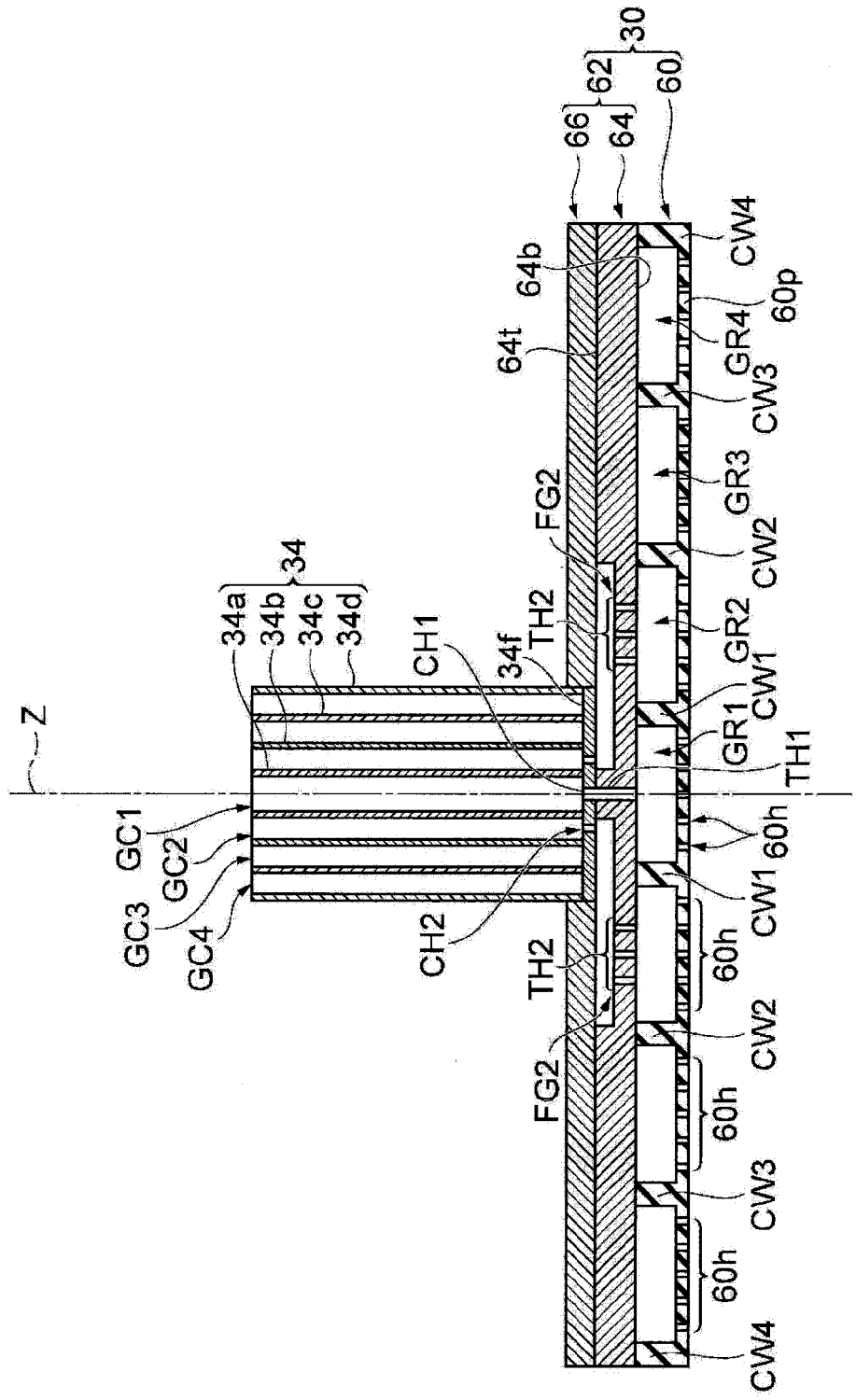
FIG. 4 is a cross-sectional view taken along line IV-IV in FIG. 2.
Figure 5:
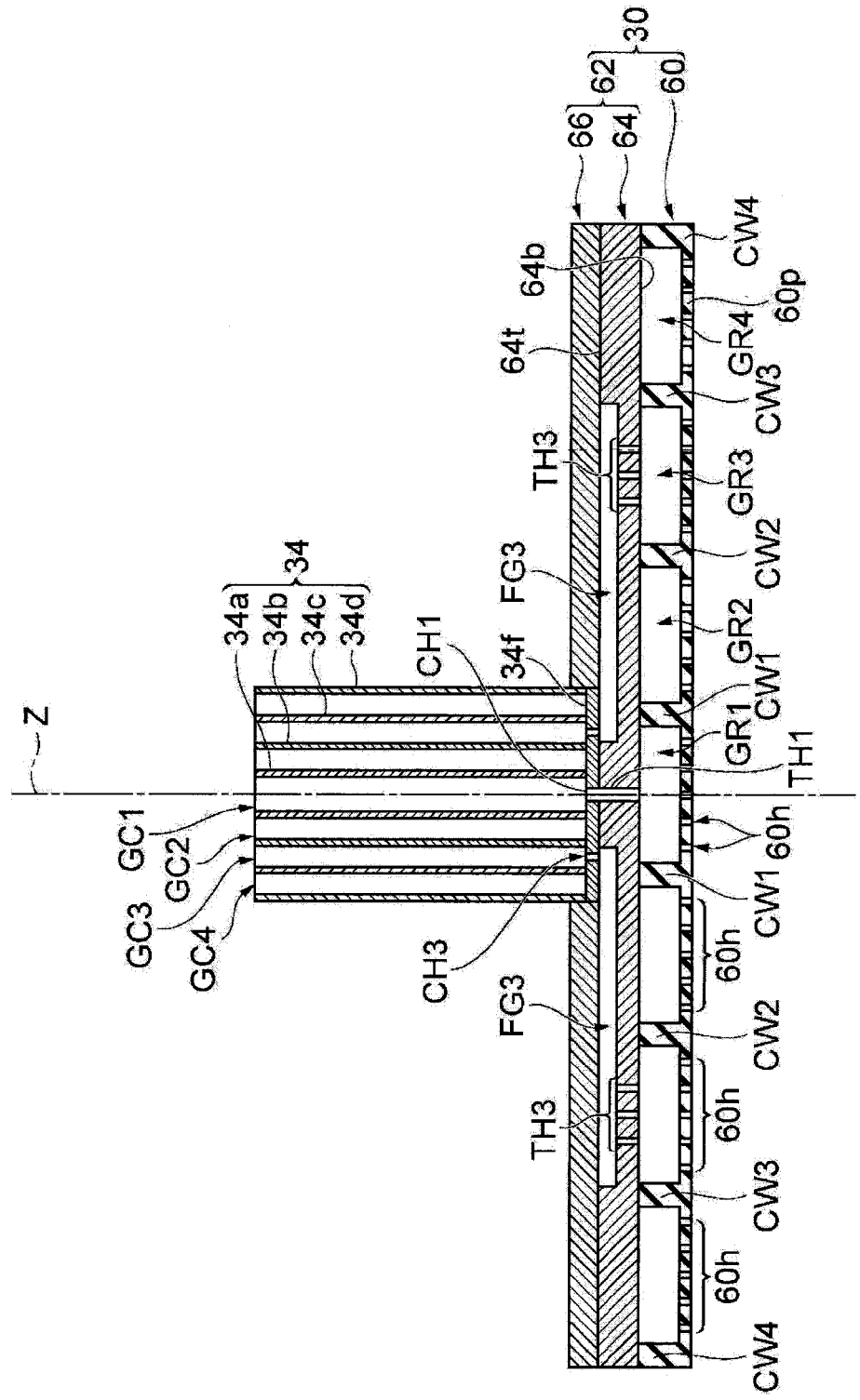
FIG. 5 is a cross-sectional view taken along line V-V in FIG. 2.
Figure 6:
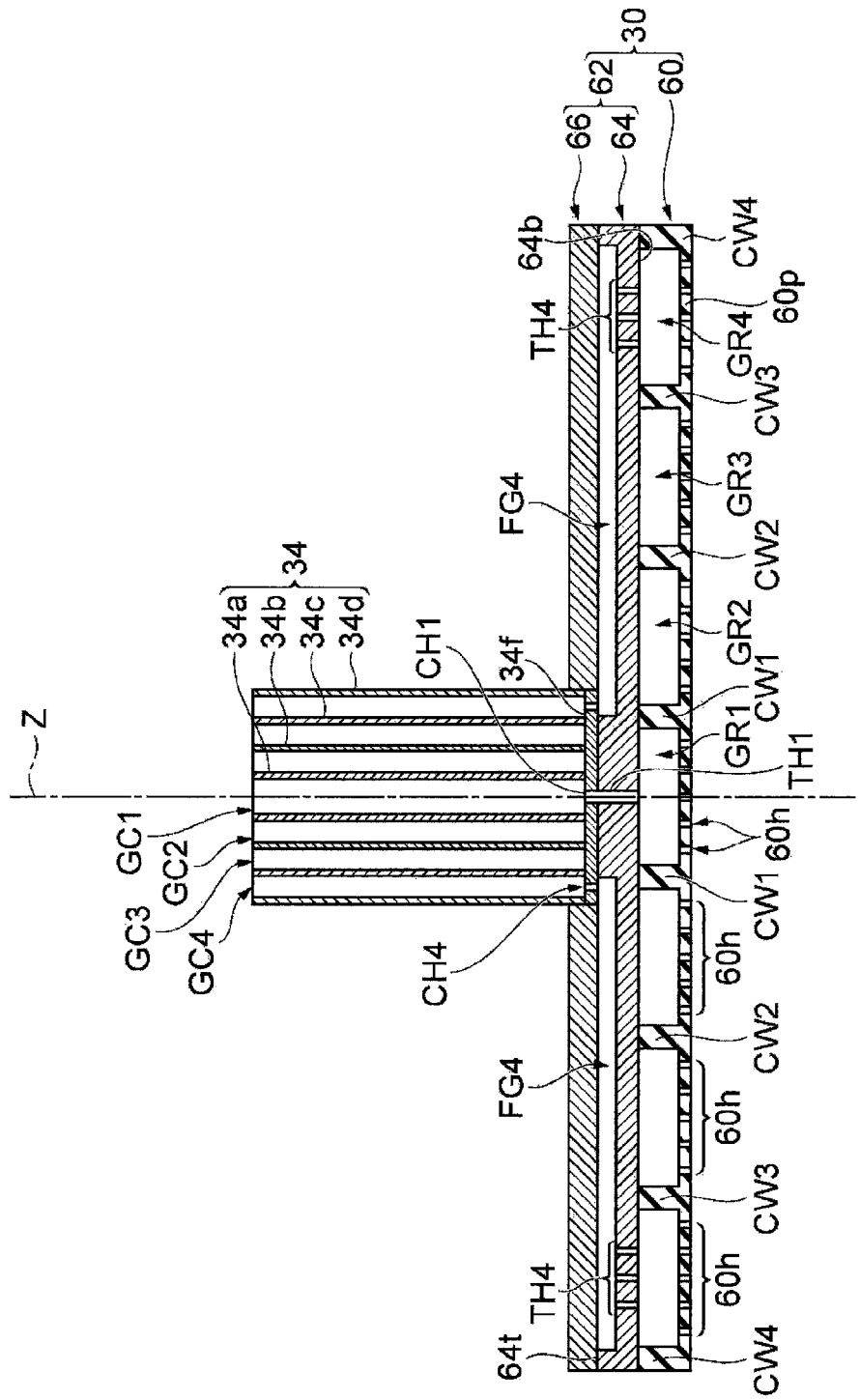
FIG. 6 is a cross-sectional view taken along line VI-VI in FIG. 2.

Hereinafter, the shower head 30 and the gas inlet tube 34 of the plasma processing apparatus 10 will be described in detain with reference to FIGS. 2 to 6. FIG. 2 is a perspective view illustrating a shower head and a gas inlet tube of an exemplary embodiment. FIG. 3 is an exploded perspective view illustrating the shower head and the gas inlet tube of FIG. 2. FIG. 4 is a cross-sectional view taken along line IV-IV in FIG. 2. FIG. 5 is a cross-sectional view taken along line V-V in FIG. 2. Further, FIG. 6 is a cross-sectional view taken along line VI-VI in FIG. 2.

The shower head 30 includes a plurality of gas diffusion chambers which are partitioned and separated from each other and provides a plurality of gas ejection holes connected to the plurality of gas diffusion chambers. In the shower head 30, the plurality of gas diffusion chambers are formed substantially coaxially with an axis Z as substantially the center thereof. The gas inlet tube 34 extends from a position above the shower head 30 along the axis Z and is connected to the shower head 30. Meanwhile, the axis Z is a central axis that passes through substantially, the center of the mounting table 16 in the vertical direction. In a state where the wafer W is placed on the electrostatic chuck 20, the axis Z is an axis that passes through substantially the center of the wafer W in the vertical direction.

In an exemplary embodiment, the shower head 30 includes an upper electrode unit 60 and a gas distribution unit 62, as illustrated in FIG. 2. The upper electrode unit 60 is made of, for example, aluminum and the surface of the upper electrode unit 60 is subjected to alumite treatment or coated with a coating material such as $Y_2O_3$. The upper electrode unit 60 has a substantially circular shape with the axis Z as the center thereof when shown in a plan view.

As illustrated in FIGS. 3 to 5, the upper electrode unit 60 includes a shower plate 60p, a first wall CW1, a second wall CW2, a third wall CW3, and a fourth wall CW4. The shower plate 60p has a substantially disc shape and is provided such that the central axis thereof substantially coincides with the axis Z. The shower plate 60p faces the mounting table 16 with the processing space S being interposed therebetween. The shower plate 60p is formed with a plurality of gas ejection holes 60h. The plurality of gas ejection holes 60h are distributed over the whole surface of the shower plate 60p. In addition, the plurality of gas ejection holes 60h penetrate the shower plate 60p and are opened toward the mounting table 16. When viewed in the direction of the axis Z, the outer edge of the shower plate 60p is positioned slightly outside the outer edge of the electrostatic chuck 20 and the outer edge of the wafer W. As a result, the gas from the shower head 30 is adapted to be supplied to the processing space S toward the front surface of the wafer W.

The first wall CW1, the second wall CW2, the third wall CW3, and the fourth wall CW4 are provided on the shower plate 60p. The first wall CW1, the second wall CW2, the third wall CW3, and the fourth wall CW4 have cylindrical shapes which are provided substantially coaxially to each other with the axis Z substantially as the center thereof. The second wall CW2 is provided around the first wall CW1 i.e., outside the first wall CW1 in the direction orthogonal to the axis Z. The third wall CW3 is provided outside the second wall CW2 and the fourth wall CW4 is provided outside the third wall CW3. The lower ends of the first wall CW1, the second wall CW2, the third wall CW3, and the fourth wall CW4 are joined to the top surface of the shower plate 60p.

In the upper electrode unit 60 configured as described above, a first gas diffusion chamber GR1 is formed inside the first wall CW1 and extends along the axis Z. In addition, a second gas diffusion chamber GR2 is formed between the first wall CW1 and the second wall CW2, a third gas diffusion chamber GR3 is formed between the second wall CW2 and the third wall CW3, and a fourth gas diffusion chamber GR4 is formed between the third wall CW3 and the fourth wall CW4. That is, in the shower head 30, the second gas diffusion chamber GR2, the third gas diffusion chamber GR3, and the fourth gas diffusion chamber GR4 extend in the circumferential direction with respect to the axis Z around the first gas diffusion chamber GR1. In other words, the first gas diffusion chamber GR1, the second gas diffusion chamber GR2, the third gas diffusion chamber GR3, and the fourth gas diffusion chamber GR4 extend substantially coaxially with the axis Z substantially as the center thereof.

On the upper electrode unit 60, the gas distribution unit 62 is provided. In the exemplary embodiment, the gas distribution unit 62 includes a first layer 64 and a second layer 66. The first layer 64 has a substantially disc shape with the axis Z substantially as the center thereof. The first layer 64 includes a top surface 64t and a bottom surface 64b. The first layer 64 is provided on the upper electrode unit 60 in such a manner that the bottom surface 64b is joined to top portions of the first wall CW1, the second wall CW2, the third wall CW3, and the fourth wall CW4. The first layer 64 is formed with a through hole TH1 extending through the axis Z. The second layer 66 is provided on the top surface 64t of the first layer 64. In the exemplary embodiment, the second layer 66 is an annular plate and is formed with a hole 66h therethrough along the axis Z.

On the top surface 64t of the first layer 64, a plurality of grooves FG2, a plurality of grooves FG3, and a plurality of grooves FG4 are formed. In the illustrated exemplary embodiment, four grooves FG2, four grooves FG3, and four grooves FG4 are respectively formed on the top surface 64t. The plurality of grooves FG2 are equally arranged at a predetermined pitch in the circumferential direction with respect to the axis Z. The plurality of grooves FG3 are also equally arranged at a predetermined pitch in the circumferential direction with respect to the axis Z. Further, the plurality of grooves FG4 are also equally arranged at a predetermined pitch in the circumferential direction with respect to the axis Z.

As illustrated in FIGS. 2, 3 and 4, the plurality of grooves FG2 extend from the vicinity of the axis Z in the radial direction in relation to the axis Z. The inner ends of the plurality of grooves FG2 in the vicinity of the axis Z are provided below the hole 66h of the second layer 66. The outer ends of the plurality of grooves FG2 in the vicinity of the axis Z are positioned above the second gas diffusion chamber GR2. The first layer 64 is formed with a plurality of through holes TH2 that interconnect the plurality of grooves FG2 and the second gas diffusion chamber GR2. In the exemplary embodiment, three through holes TH2 extend from each groove FG2 to the second gas diffusion chamber GR2 in which the three through hole TH2 are arranged in the radial direction with respect to the axis Z. Meanwhile, the number of the through holes TH2 extending from each groove FG2 to the second gas diffusion chamber GR2 may be any optional number of one or more.

In addition, as illustrated in FIGS. 2, 3 and 5, the plurality of grooves FG3 extend in the radial direction from the vicinity of the axis Z. The inner ends of the plurality of grooves FG3 in the vicinity of the axis Z are positioned below the hole 66h of the second layer 66. The outer ends of the plurality of grooves FG3 in the vicinity of the axis Z are positioned above the third gas diffusion chamber GR3. The first layer 64 is formed with a plurality of through holes TH3 that interconnect the plurality of grooves FG3 and the third gas diffusion chamber GR3. In the exemplary embodiment, three through holes TH3 extend from each groove FG3 to the third gas diffusion chamber GR3 in which the three through holes TH3 are arranged in the radial direction. Meanwhile, the number of the through holes TH3 extending from each groove FG3 to the third gas diffusion chamber GR3 may be any optional number of one or more.

In addition, as illustrated in FIGS. 2, 3 and 6, the plurality of grooves FG4 extend from the vicinity of the axis Z in the radial direction with respect to the axis Z. The inner ends of the plurality of grooves FG4 in the vicinity of the axis Z are positioned below the hole 66h of the second layer 66. The outer ends of the plurality of grooves FG4 in the vicinity of the axis Z are positioned above the fourth gas diffusion chamber GR4. The first layer 64 is positioned with a plurality of through holes TH4 that interconnect the plurality of grooves FG4 and the fourth gas diffusion chamber GR4. In the exemplary embodiment, three through holes TH4 extend from each of the grooves FG4 to the fourth gas diffusion chamber GR4 in which the three through holes TH4 are arranged in the radial direction. Meanwhile, the number of the through holes TH4 extending from each groove FG4 to the fourth gas diffusion chamber GR4 may be any number of one or more.

The gas inlet tube 34 connected to the shower head 30 includes a first tube wall 34a, a second tube wall 34b, a third tube wall 34c, and a fourth tube wall 34d. The first tube wall 34a has a substantially cylindrical shape that extends in a direction where the axis Z extends (hereinafter, referred to as an "axis Z direction") with the axis Z substantially as the center thereof. The second tube wall 34b has a substantially cylindrical shape that extends in the axis Z direction and is provided outside the first tube wall 34a to surround the first tube wall 34a. The third tube wall 34c has a substantially cylindrical shape that extends in the axis Z direction and is provided outside the second tube wall 34b to surround the second tube wall 34b. Further, the fourth tube wall 34d has a substantially cylindrical shape that extends in the axis Z direction and is provided outside the third tube wall 34c to surround the third tube wall 34c. That is, in the gas inlet tube 34 of the exemplary embodiment, the first tube wall 34a, the second tube wall 34b, the third tube wall 34c, and the fourth tube wall 34d are arranged substantially coaxially with the axis Z substantially as the center thereof.

The gas inlet tube 34 defines a first gas inlet path GC1 inside the first tube wall 34a, a second gas inlet path GC2 between the first tube wall 34a and the second tube wall 34b, a third gas inlet path GC3 between the second tube wall 34b and the third tube wall 34c, and a fourth gas inlet path GC4 between the third tube wall 34c and the fourth tube wall 34d. That is, the gas inlet tube 34 defines the first to fourth gas inlet paths GC1 to GC4 which are provided coaxially with the axis Z as the center thereof.

In the exemplary embodiment, the gas inlet tube 34 additionally includes a lower end wall 34f. To the lower end wall 34f, the lower ends of the first tube wall 34a, the second tube wall 34b, the third tube wall 34c, and the fourth tube wall 34d are joined. The lower end wall 34f is formed with a through hole CH1 that extends along the axis Z. The upper end of the through hole CH1 is connected to the first gas inlet path GC1 and the lower end of the through hole CH1 is connected to the through hole TH1 of the first layer 64. The first gas inlet path GC1 is connected to the first gas diffusion chamber GR1 through the through hole CH1 and the through hole TH1. As a result, a gas flowing in the first gas inlet path GC1 is guided into the first gas diffusion chamber GR1 and is supplied mainly toward the central area of the wafer W from the gas ejection holes 60h connected to the first gas diffusion chamber GR1.

In addition, as illustrated in FIGS. 3 and 4, the lower end wall 34f is formed with a plurality of through holes CH2. The upper ends of the plurality of through holes CH2 are connected to the second gas inlet path GC2 and the lower ends of the through holes CH2 are connected to the inner ends of the plurality of grooves FG2, respectively. Accordingly, the second gas inlet path GC2 is connected to the second gas diffusion chamber GR2 through the through holes CH2, the grooves FG2, and the through holes TH2. As a result, a gas flowing in the second gas inlet path GC2 is guided into the second gas diffusion chamber GR2 and is supplied mainly toward an intermediate region between the central region and the edge of the wafer W from the gas ejection holes 60h connected to the second gas diffusion chamber GR2.

In addition, as illustrated in FIGS. 3 and 5, the lower end wall 34f is formed with a plurality of through holes CH3. The upper ends of the plurality of through holes CH3 are connected to the third gas inlet path GC3 and the lower ends of the plurality of through holes CH3 are connected to the inner ends of the plurality of grooves FG3, respectively. Accordingly, the third gas inlet path GC3 is connected to the third gas diffusion chamber GR3 through the through holes CH3, the grooves FG3, and the through holes TH3. As a result, a gas flowing in the third gas inlet path GC3 is guided into the third gas diffusion chamber GR3 and supplied mainly toward a region in the vicinity of the edge of the wafer W from the gas ejection holes 60h connected to the third gas diffusion chamber GR3.

Meanwhile, as illustrated in FIGS. 3 and 6, the lower end wall 34f is formed with a plurality of through holes CH4. The upper ends of the plurality of through holes CH4 are connected to the fourth gas inlet path GC4 and the lower ends of the plurality of through holes CH4 are connected to the inner ends of the plurality of grooves FG4, respectively. Accordingly, the fourth gas inlet path GC4 is connected to the fourth gas diffusion chamber GR4 through the through holes CH4, the grooves FG3, and the through holes TH4. As a result, a gas flowing in the fourth gas inlet path GC4 is guided into the fourth gas diffusion chamber GR4 and supplied mainly toward the edge of the wafer W from the gas ejection holes 60h connected to the fourth gas diffusion chamber GR4.

In addition, each of the first to fourth gas inlet paths GC1 to GC4 may be connected with one or more dedicated gas sources through a valve and a flow controller (e.g., a mass flow controller). Alternatively, gases from one or more gas sources may be supplied to two or more gas inlet paths among the first to fourth inlet paths GC1 to GC4 through a flow splitter.

In the plasma processing apparatus 10 of the exemplary embodiment as described above, the plurality of gas diffusion chambers GR1 to GR4 are provided coaxially with respect to the axis Z within the shower head 30. In addition, the gas inlet tube 34 that defines the gas inlet paths GC1 to GC4 coaxially with respect to the axis Z is connected to the shower head 30. Accordingly, the distances from the second gas inlet path GC2 to the respective regions in the circumferential direction of the second gas diffusion chamber GR2 are substantially equal to each other, the distances from the third gas inlet path GC3 to the respective regions in the circumferential direction of the third gas diffusion chamber GR3 are substantially equal to each other, and the distances from the fourth gas inlet path GC4 to the respective regions in the circumferential direction of the fourth gas diffusion chamber GR4 are substantially equal to each other. As a result, the deviation in gas diffusion may also be reduced in the gas diffusion chambers GR2 to GR4 provided outside the first gas diffusion chamber GR1 in addition to the first gas diffusion chamber GR1 provided at the center. In addition, the gas inlet tube 34 connected to the shower head 30 may provide the first to fourth gas inlet paths GC1 to GC4 in a coaxial form with a simple configuration based on a plurality of coaxially provided tube walls.

In addition, in the gas distribution unit 62, a plurality of grooves extending in the radial direction are equally arranged in the circumferential direction to form gas flow paths, and the plurality of grooves extend from a position below the corresponding gas inlet paths to a position above the corresponding gas diffusion chambers. Accordingly, a gas may be evenly guided to the gas diffusion chambers provided outside the first gas diffusion chamber GR1.

In addition, a plurality of radially arranged through holes are interposed between each groove formed in the gas distribution unit 62 and a corresponding gas diffusion chamber. Accordingly, deviation in gas diffusion within the gas diffusion chamber may be reduced.

Figure 7:
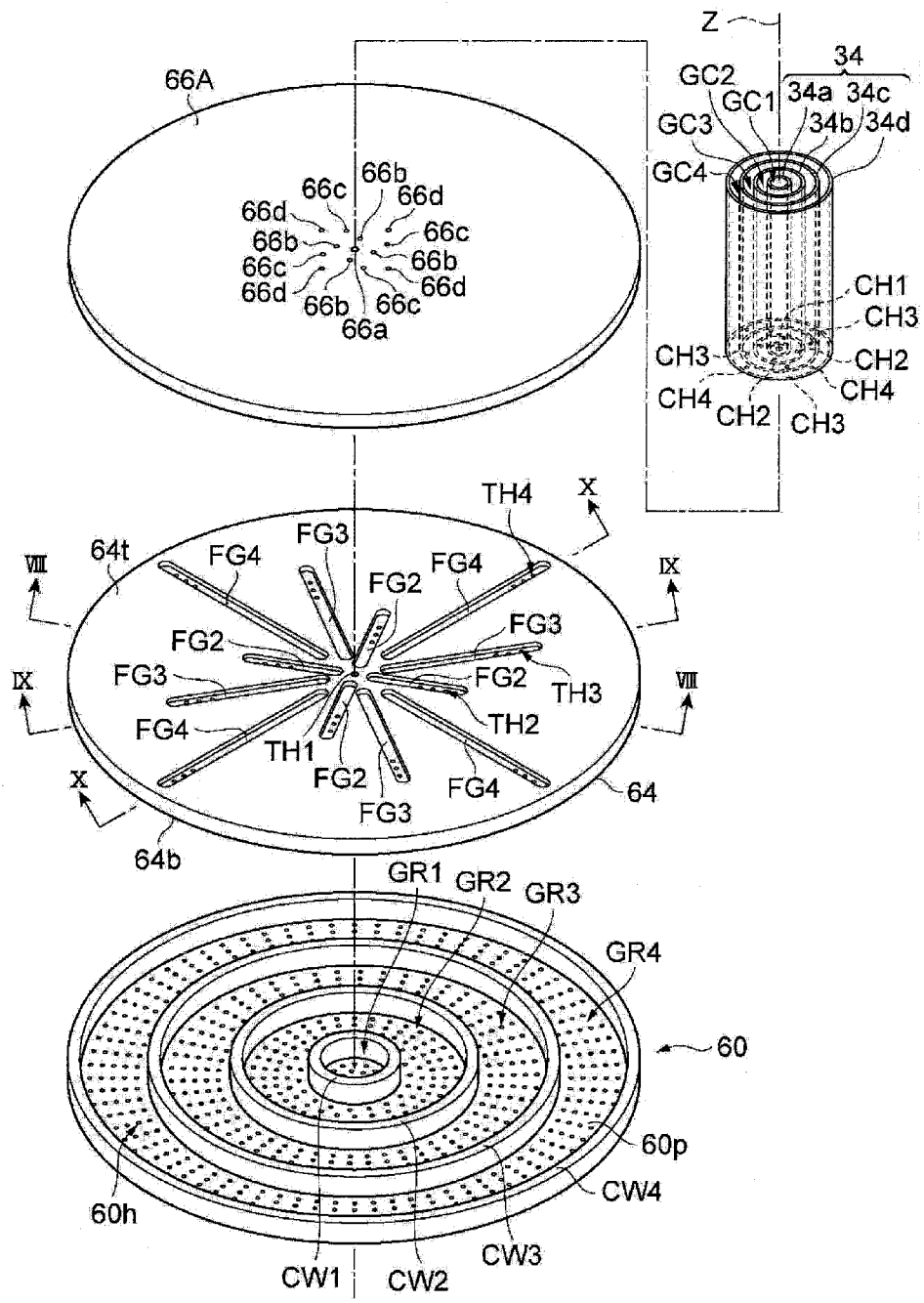
FIG. 7 is an exploded perspective view illustrating a shower head and a gas inlet tube of another exemplary embodiment.
Figure 8:
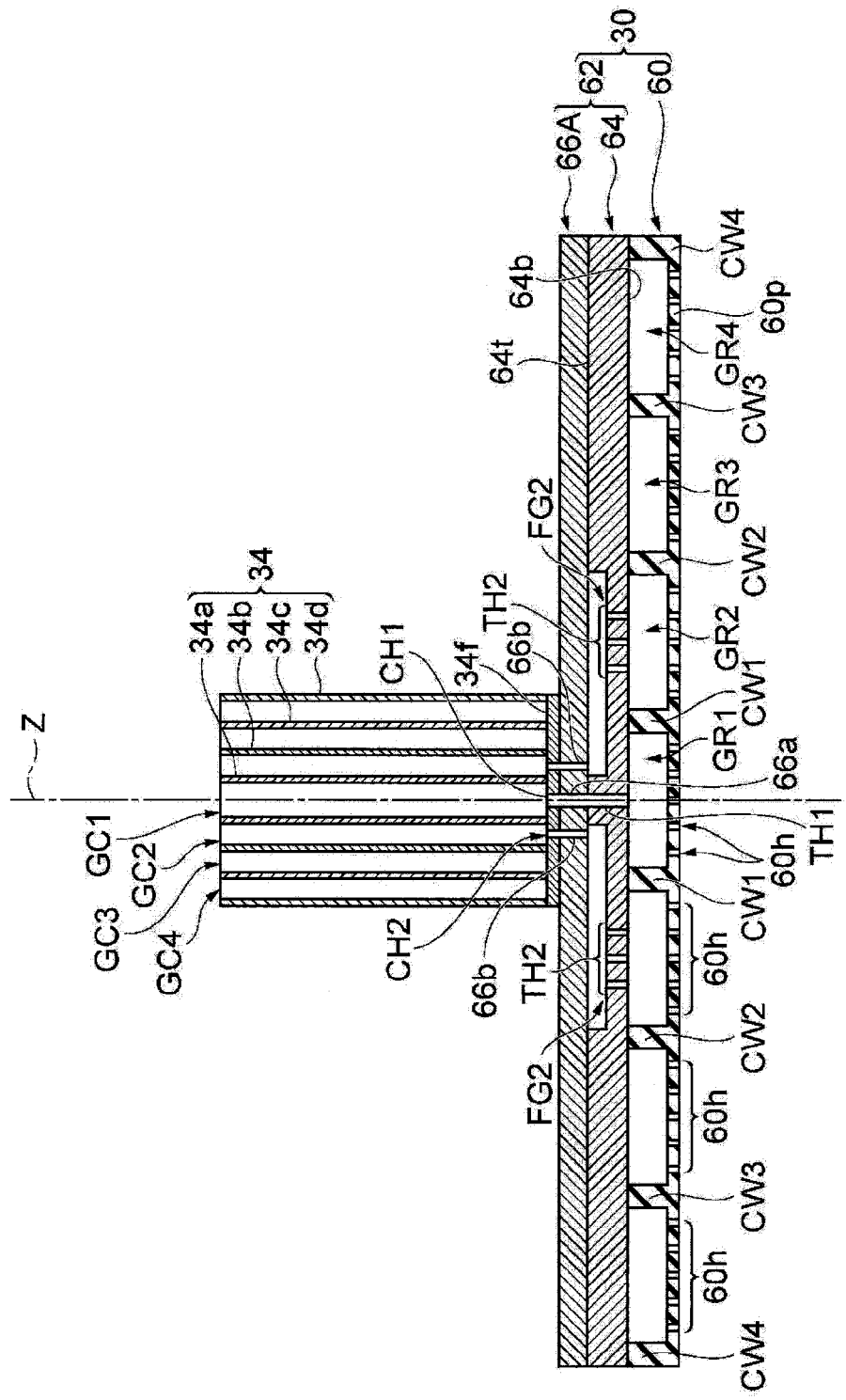
FIG. 8 is a cross-sectional view of an assembly of the shower head and the gas inlet tube of FIG. 7 which is taken along line VIII-VIII.
Figure 9:
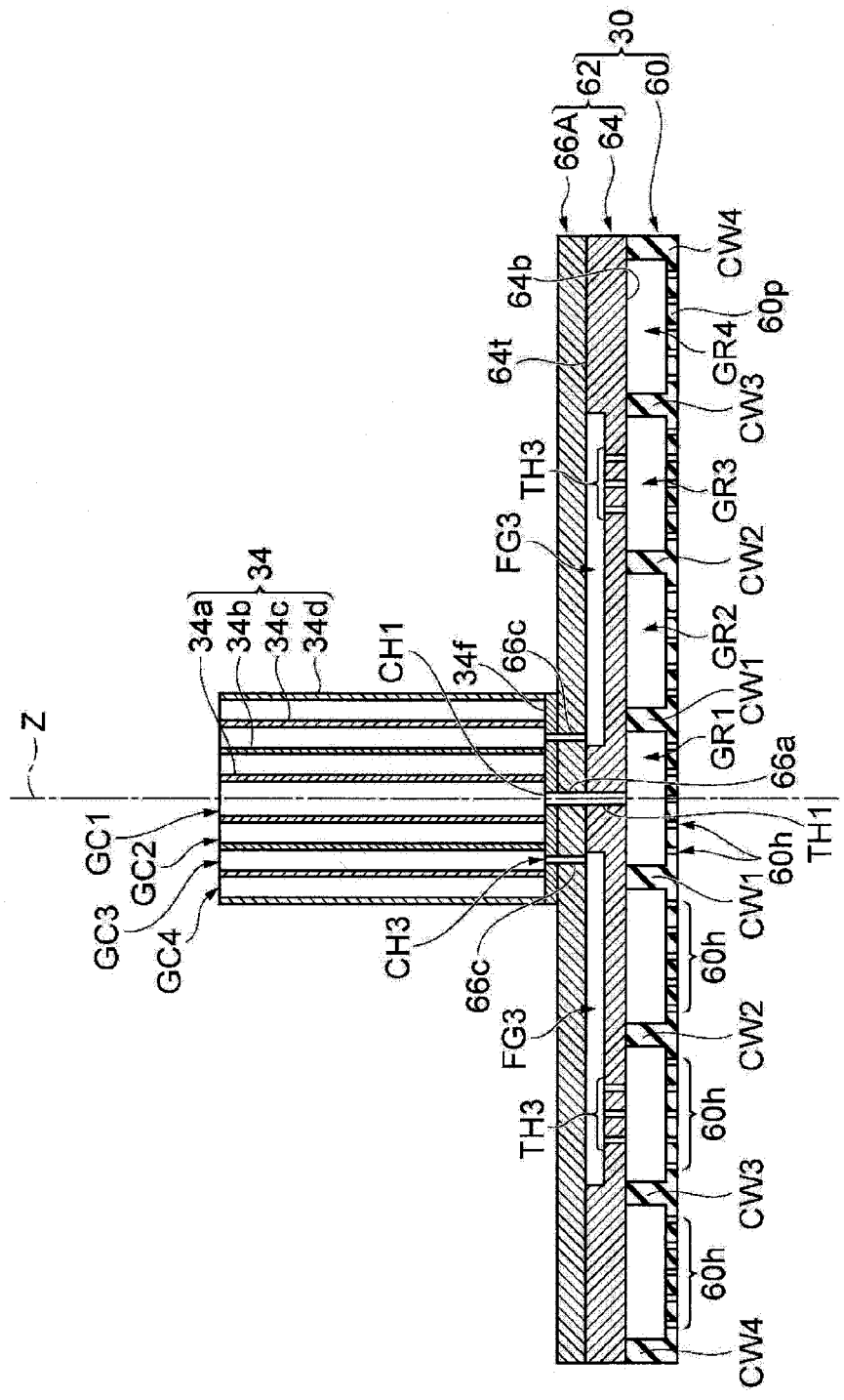
FIG. 9 is a cross-sectional view of the assembly of the shower head and the gas inlet tube which is taken along line IX-IX in FIG. 7.
Figure 10:
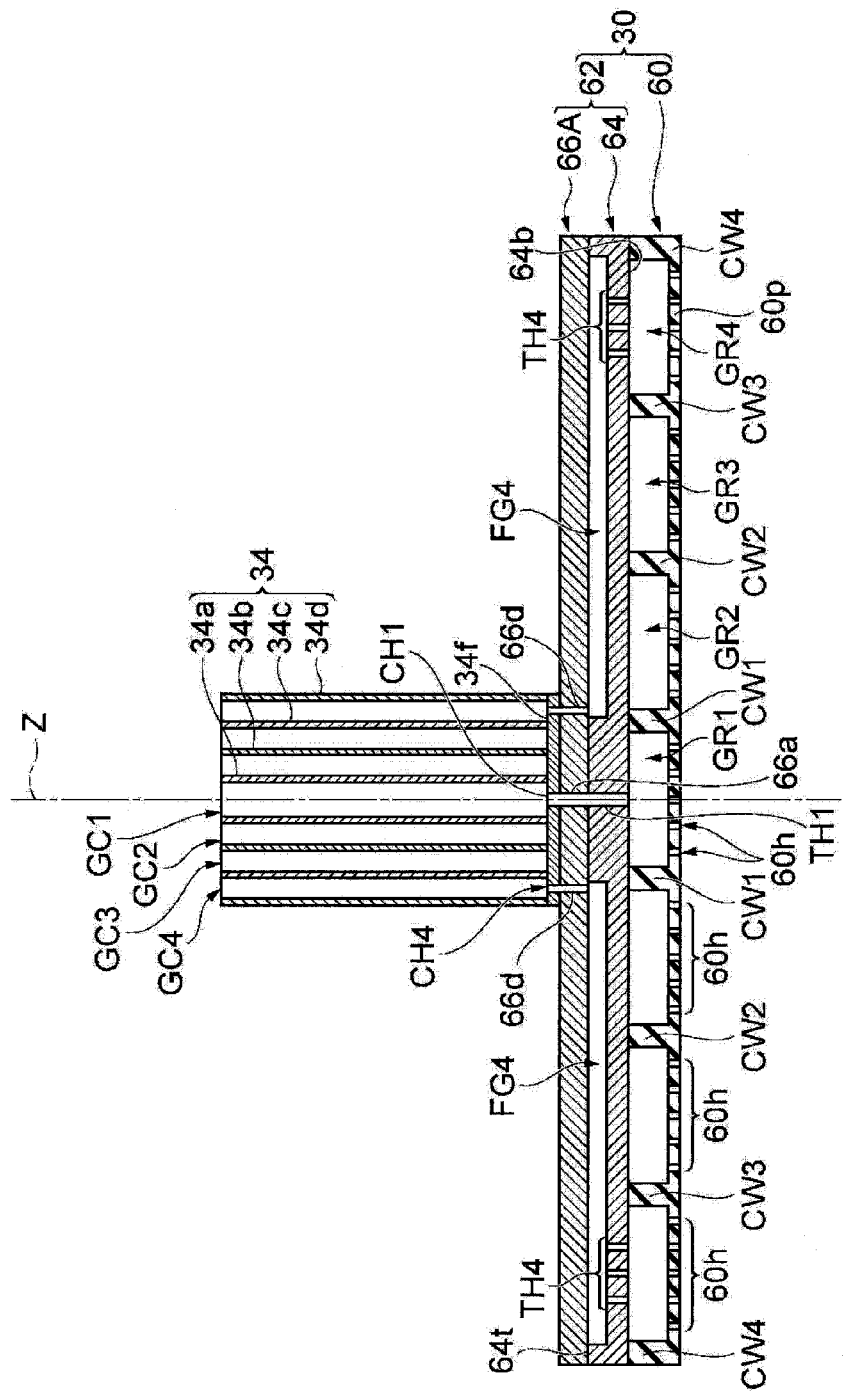
FIG. 10 is a cross-sectional view of the assembly of the shower head and the gas inlet tube which is taken along line X-X in FIG. 7.

Hereinafter, another exemplary embodiment will be described. FIG. 7 is an exploded perspective view illustrating a shower head and a gas inlet tube according to another exemplary embodiment. FIGS. 8 to 10 are cross-sectional views of an assembly of the shower head and the gas inlet tube illustrated in FIG. 7 in which FIG. 8 is a cross-sectional view taken along line VIII-VIII in FIG. 7, FIG. 9 is a cross-sectional view taken along line IX-IX in FIG. 7, and FIG. 10 is a cross-sectional view taken along line X-X in FIG. 7.

As illustrated in FIGS. 7 to 10, the shower head 30 may include a second layer 66A instead of the second layer 66. In the present exemplary embodiment, the lower end wall 34f of the gas inlet tube 34 is in contact with the top surface of the second layer 66A. For this reason, the second layer 66A is formed with a through hole 66a, a plurality of through holes 66b, a plurality of through holes 66c, and a plurality of through holes 66d. The through hole 66a is interposed between the through hole TH1 and the through hole CH1. The plurality of through holes 66b are interposed between the inner ends of the plurality of grooves FG2 and the plurality of through holes CH2, respectively. The plurality of through holes 66c are interposed between the inner ends of the plurality of grooves FG3 and the plurality of through holes CH3, respectively. Further, the plurality of through holes 66d are interposed between the inner ends of the plurality of grooves FG4 and the plurality of through holes CH4, respectively. Also in the present exemplary embodiment, the gases from the gas inlet paths GC1 to GC4 of the gas inlet tube 34 may be guided to the gas diffusion chambers GR1 to GR4, respectively.

Figure 11:
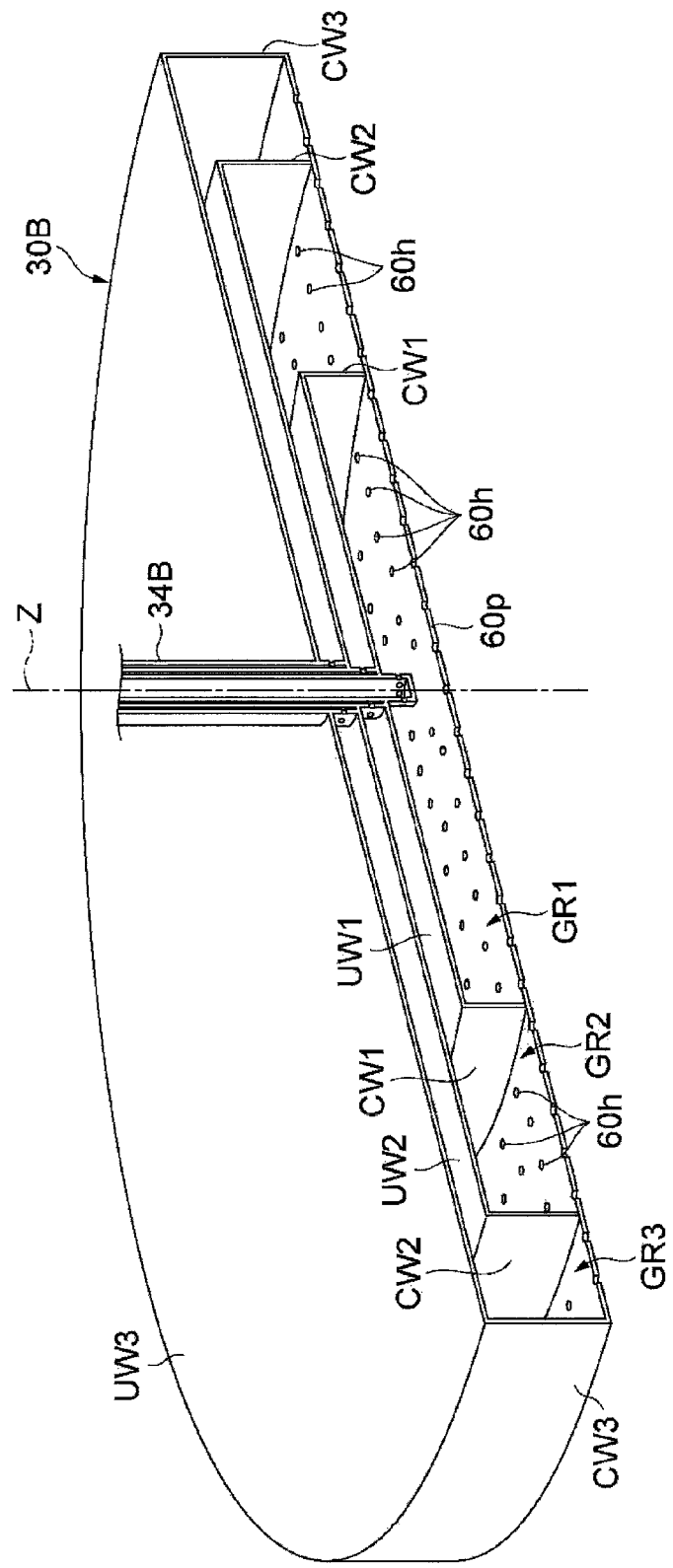
FIG. 11 is a partly broken away perspective view illustrating a shower head and a gas inlet tube of still another exemplary embodiment.
Figure 12:
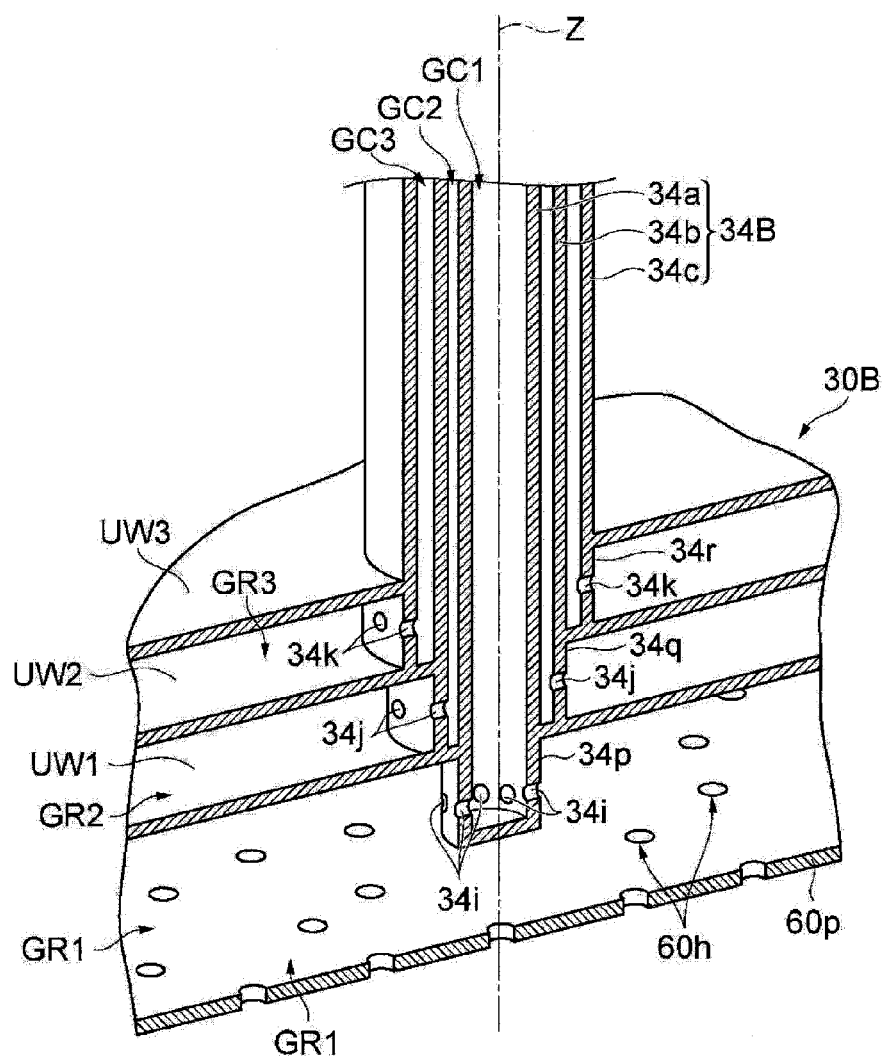
FIG. 12 is a partly broken away perspective view illustrating a portion of the shower head and the gas inlet tube of FIG. 11 in an enlarged scale.

Next, reference will be made on FIGS. 11 and 12. FIG. 11 is a partly broken away perspective view illustrating a shower head and a gas inlet tube of still another exemplary embodiment. Further, FIG. 12 is a partly broken away perspective view illustrating a portion of the shower head and the gas inlet tube of FIG. 11, i.e., the vicinity of the gas inlet tube in an enlarged scale. In the present exemplary embodiment, the plasma processing apparatus 10 may be provided with a shower head 30B and a gas inlet tube 34B illustrated in FIGS. 11 and 12 instead of the shower head 30 and the gas inlet tube 34.

The shower head 30B defines three gas diffusion chambers GR1, GR2, GR3. The shower head 30B includes a shower plate 60p, a first wall CW1, a second wall CW2, a third wall CW3, a first upper wall UW1, a second upper wall UW2, and a third upper wall UW3.

The first wall CW1 has a cylindrical shape that extends in the axis Z direction with the axis Z substantially as the center thereof. In addition, the second wall CW2 has a cylindrical shape that extends in the axis Z direction with the axis Z substantially as the center thereof and is provided outside the first wall CW1. In addition, the third wall CW3 has a cylindrical shape that extends in the axis Z with the axis Z substantially as the center thereof and is provided outside the second wall CW2. The lower ends of the first to third walls CW1 to CW3 are joined to the shower plate 60p.

On the first wall CW1, the first upper wall UW1 is provided. The first upper wall UW1 has a substantially disc shape and is joined to the top portion of the first wall CW1 at the outer edge thereof. A first gas diffusion chamber GR1 is formed below the first upper wall UW1 and inside the first wall CW1.

The second wall CW2 extends to a position higher than the top portion of the first wall CW1 in the axis Z direction. On the second wall CW2, the second upper wall UW2 is provided. The second upper wall UW2 has a substantially disc shape and is joined to the top portion of the second wall CW2 at the edge thereof. Between the second upper wall UW2 and the first upper wall UW1 and between the first wall CW1 and the second wall CW2, a second gas diffusion chamber GR2 is formed.

The third wall CW3 extends to a position higher than the top portion of the second wall CW2 in the axis Z direction. On the third wall CW3, the third upper wall UW3 is provided. The third upper wall UW3 has a substantially disc shape and is joined to the top portion of the third wall CW3 at the edge thereof. Between the third upper wall UW3 and the second upper wall UW2, and between the second wall CW2 and the third wall CW3, a third gas diffusion chamber GR3 is formed.

In the shower head 30B configured as described above, the first gas diffusion chamber GR1 is provided along the axis Z. In addition, the second gas diffusion chamber GR2 extends in the circumferential direction with respect to the axis Z around the first gas diffusion chamber GR1 and the third gas diffusion chamber GR3 extends in the circumferential direction with respect to the axis Z around the second gas diffusion chamber GR2. In addition, the second gas diffusion chamber GR2 extends from the vicinity of the axis Z over the top portion of the first gas diffusion chamber GR1, and extends above the shower plate 60p. In addition, the third gas diffusion chamber GR3 extends from the vicinity of the axis Z over the top portion of the second gas diffusion chamber GR2, and extends above the shower plate 60p.

In addition, the gas inlet tube 34B includes a first tube wall 34a, a second tube wall 34b, and a third tube wall 34c. The first tube wall 34a has a substantially cylindrical shape that extends in the axis Z direction with the axis Z substantially as the center thereof. The second tube wall 34b has a substantially cylindrical shape that extends in the axis Z and is provided outside the first tube wall 34a. The third tube wall 34c has a substantially cylindrical shape that extends in the axis Z direction and is provided outside the second tube wall 34b. The gas inlet tube 34B defines a first gas inlet path GC1 inside the first tube wall 34a, a second gas inlet path GC2 between the first tube wall 34a and the second tube wall 34b, and a third gas inlet path GC3 between the second tube wall 34b and the third tube wall 34c.

The lower end portion 34p of the first tube wall 34a extends to the inside of the first gas diffusion chamber GR1. The lower end portion 34p of the first tube wall 34a is formed with a plurality of holes 34i that penetrate the first tube wall 34a in the radial direction with respect to the axis Z. The plurality of holes 34i are equally arranged in the circumferential direction with respect to the axis Z. Accordingly, the gas from the first gas inlet path GC1 is ejected into the first gas diffusion chamber GR1 in the radial direction and also uniformly diffused in the circumferential direction.

The lower end portion 34q of the second tube wall 34b adjoins the second gas diffusion chamber GR2 between the first upper wall UW1 and the second upper wall UW2. The lower end portion 34q of the second tube wall 34b is formed with a plurality of holes 34j that penetrate the second tube wall 34b in the radial direction with respect to the axis Z. The plurality of holes 34j are equally arranged in the circumferential direction with respect to the axis Z. Accordingly, the gas from the second gas inlet path GC2 is ejected into the second gas diffusion chamber GR2 in the radial direction and also uniformly diffused in the circumferential direction.

Further, the lower end portion 34r of the third tube wall 34c adjoins the third gas diffusion chamber GR3 between the second upper wall UW2 and the third upper wall UW3. The lower end portion 34r of the third tube wall 34c is formed with a plurality of holes 34k that penetrate the third tube wall 34c in the radial direction with respect to the axis Z. The plurality of holes 34k are equally arranged in the circumferential direction with respect to the axis Z. Accordingly, the gas from the third gas inlet path GC3 is ejected into the third gas diffusion chamber GR3 in the radial direction and also uniformly diffused in the circumferential direction.

Although various exemplary embodiments have been described above, the present disclosure is not limited to the above-described exemplary embodiments and various modified embodiments may be made. For example, the number of the gas diffusion chambers formed in the shower head may be any number of two or more and the number of the gas inlet paths defined by the gas inlet tube may be changed to an optional number corresponding to the number of the gas diffusion chambers.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing container;
   a mounting table provided within the processing container and including a lower electrode;
   a shower head provided above the mounting table and constituting an upper electrode; and
   a gas inlet tube provided above the shower head and connected to the shower head,
   wherein the shower head is formed with a plurality of gas ejection holes which are opened downwardly, and provided with a first gas diffusion chamber and a second gas diffusion chamber on the plurality of gas ejection holes, the first gas diffusion chamber and the second gas diffusion chamber being separated from each other,
   the first gas diffusion chamber extends along a central axis that passes through a center of the mounting table,
   the second gas diffusion chamber extends in a circumferential direction with respect to the central axis at least around the first gas diffusion chamber, and
   the gas inlet tube includes a cylindrical first tube wall provided along the central axis and a cylindrical second tube wall provided outside the first tube wall, the gas inlet tube defining a first gas inlet path configured to introduce a gas into the first gas diffusion chamber, inside the first tube wall, and a second gas inlet path configured to introduce a gas into the second gas diffusion chamber, between the first tube wall and the second tube wall.

2. The plasma processing apparatus of claim 1, wherein the shower head includes:
   a shower plate formed with the plurality of gas ejection holes,
   a first wall having a cylindrical shape that extends in a direction where the central axis extends, the first wall being provided on the shower plate and defining the first gas diffusion chamber,
   a second wall having a cylindrical shape that extends in the direction where the central axis extends, the second wall being provided on the shower plate and around the first wall and defining the second gas diffusion chamber together with the first wall, and
   a gas distribution unit provided on the first wall and the second wall,
   wherein the gas distribution unit is provided with a plurality of gas flow paths that extend in a radial direction with respect to the central axis from a position below the second gas inlet path to a position above the second gas diffusion chamber.

3. The plasma processing apparatus of claim 2, wherein the gas distribution unit includes:
   a first layer including a top surface and a bottom surface joined to a top portion of the first wall and a top portion of the second wall, respectively, and
   a second layer provided on the top surface of the first layer,
   wherein a plurality of grooves that extend in the radial direction with respect to the central axis from a position below the second gas inlet path to a position above the second gas diffusion chamber are formed on the top surface of the first layer, the plurality of grooves constituting the plurality of gas flow paths, and
   the first layer is formed with a plurality of through holes that penetrate the first layer above the second gas diffusion chamber to interconnect the plurality of gas flow paths and the second gas diffusion chamber.

4. The plasma processing apparatus of claim 1, wherein the shower head includes:
   a shower plate formed with the plurality of gas ejection holes,
   a first wall having a cylindrical shape that extends in a direction where the central axis extends, the first wall being provided on the shower plate,
   a second wall having a cylindrical shape that extends in the direction where the central axis extends, the second wall being provided on the shower plate and around the first wall,
   a first upper wall provided on the first wall to face the shower plate, and
   a second upper wall provided on the second wall to face the shower plate at a position above the first upper wall,
   wherein the first gas diffusion chamber is formed inside the first wall and below the first upper wall, the second gas diffusion chamber is formed between the first wall and the second wall and between the first upper wall and the second upper wall, the first tube wall includes a lower end portion that adjoins the first gas diffusion chamber, the lower end portion of the first tube wall being formed with a plurality of first holes that communicate the first gas inlet path and the first gas diffusion chamber with each other, and the second tube wall includes a lower end portion that adjoins the second gas diffusion chamber between the first upper wall and the second upper wall, the lower end portion of the second tube wall being formed with a plurality of second holes that communicate the second gas inlet path and the second gas diffusion chamber with each other.

5. The plasma processing apparatus of claim 4, wherein the plurality of first holes and the plurality of second holes extend in the radial direction with respect to the central axis, the plurality of first holes are equally arranged in the circumferential direction with respect to the central axis, and the plurality of second holes are equally arranged in the circumferential direction with respect to the central axis.

6. The plasma processing apparatus of claim 1, wherein the shower head further includes a third gas diffusion chamber provided on the plurality of gas ejection holes that are opened downwardly, wherein the third gas diffusion chamber extends in the circumferential direction with respect to the central axis at least around the second gas diffusion chamber, and the gas inlet tube further includes a cylindrical third tube wall provided outside the second tube wall and defines a third gas inlet path configured to introduce a gas into the third gas diffusion chamber, between the second tube wall and the third tube wall.

* * * * *